US012660219B2

(12) United States Patent
Yoshikawa

(10) Patent No.: US 12,660,219 B2
(45) Date of Patent: Jun. 16, 2026

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Daiki Yoshikawa, Kanazawa Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 597 days.

(21) Appl. No.: 18/176,995

(22) Filed: Mar. 1, 2023

(65) Prior Publication Data

US 2024/0055505 A1 Feb. 15, 2024

(30) Foreign Application Priority Data

Aug. 9, 2022 (JP) ................................. 2022-127037

(51) Int. Cl.
H10D 12/00 (2025.01)
H10D 62/17 (2025.01)
(52) U.S. Cl.
CPC ......... H10D 12/481 (2025.01); H10D 62/393 (2025.01)
(58) Field of Classification Search
CPC ....... H10D 12/411–491; H10D 12/481; H10D 12/01; H10D 12/031–038; H10D 12/421;
(Continued)

(56) References Cited

U.S. PATENT DOCUMENTS 9,786,771 B2 10/2017 Matsuura
9,966,372 B2 5/2018 Kameyama et al.
(Continued)

FOREIGN PATENT DOCUMENTS

JP H11-345969 A 12/1999
JP 2015-177010 A 10/2015
(Continued)

OTHER PUBLICATIONS

Notice of Reasons for Refusal mailed Jun. 11, 2025 in corresponding Japanese Patent Application No. 2022-127037, 22 pages (with Translation).

*Primary Examiner* — Natalia A Gondarenko
(74) *Attorney, Agent, or Firm* — Kim & Stewart LLP

(57) ABSTRACT
According to one embodiment, a semiconductor device includes first and second electrodes, first to fifth semiconductor regions, and a gate electrode. The first semiconductor region is located on the first electrode. The second semiconductor region is located on the first semiconductor region. The gate electrode faces the second semiconductor region via a gate insulating layer. The third semiconductor region is located on the second semiconductor region. The fourth semiconductor region is located on the second semiconductor region. An impurity concentration of the fourth semiconductor region is greater than an impurity concentration of the second semiconductor region. The second electrode is located on the second, third, and fourth semiconductor regions. The second electrode includes a contact part. The fifth semiconductor region is located between the second semiconductor region and the contact part. An impurity concentration of the fifth semiconductor region is greater than the impurity concentration of the second semiconductor region.

11 Claims, 7 Drawing Sheets

(58) Field of Classification Search
CPC ............... H10D 12/441; H10D 12/461; H10D
30/0281–0289; H10D 30/0267; H10D
30/0287; H10D 30/0295; H10D
30/601–608; H10D 30/66; H10D 30/668;
H10D 62/141–148; H10D 62/124; H10D
62/117; H10D 62/126; H10D 62/127;
H10D 62/393; H10D 62/152–155; H10D
62/156–159; H10D 84/40–409; H10D
30/658; H10D 30/65–659; H10D 30/603;
H10D 8/045; H10D 8/422; H10D 64/117;
H10D 64/20; H10D 64/23; H10D 64/231;
H10D 64/251; H10D 64/252; H10D
64/256; H10D 64/512; H10D 64/519;
H10D 62/10; H10D 62/106; H10D
62/112; H10D 62/142; H10D 62/129;
H10D 62/133; H10D 62/137; H10D
62/145; H10D 62/149; H10D 62/177;
H10D 62/292; H10D 84/0123; H10D
84/0126; H10D 84/101; H10D 84/135;
H10D 84/141; H10D 84/143; H10D
84/146; H10D 84/148; H10D 84/161;
H10D 84/406; H10D 84/613; H10D
84/8312; H10D 89/601; H10D 89/611
USPC ............... 257/139, 140, 335, 337, 324, 343,
257/29.256, 29.261, 29.268
See application file for complete search history.

(56) References Cited

U.S. PATENT DOCUMENTS

| | | |
|---|---|---|
| 2015/0263150 A1 | 9/2015 | Matsudai et al. |
| 2016/0035868 A1 | 2/2016 | Naito |
| 2019/0097030 A1 | 3/2019 | Miyata |
| 2020/0135717 A1 | 4/2020 | Takahashi |
| 2021/0234027 A1 | 7/2021 | Yoshida |
| 2022/0216314 A1 | 7/2022 | Harada |
| 2023/0261097 A1 | 8/2023 | Noguchi |
| 2023/0299077 A1* | 9/2023 | Muramatsu ......... H10D 64/519 |
| | | 257/140 |

FOREIGN PATENT DOCUMENTS

| | | | |
|---|---|---|---|
| JP | 2016-033993 A | 3/2016 |
| JP | 6245107 B2 | 12/2017 |
| JP | 6605870 B2 | 11/2019 |
| JP | 2020-072137 A | 5/2020 |
| WO | 2018/056233 A1 | 3/2018 |
| WO | 2020/213254 A1 | 10/2020 |
| WO | 2021/210293 A1 | 10/2021 |
| WO | 2022/244802 A1 | 11/2022 |

* cited by examiner

SEMICONDUCTOR DEVICE

CROSS-REFERENCE TO RELATED APPLICATIONS

This application is based upon and claims the benefit of priority from Japanese Patent Application No. 2022-127037, filed on Aug. 9, 2022; the entire contents of which are incorporated herein by reference.

FIELD

Embodiments described herein relate generally to a semiconductor device.

BACKGROUND

Semiconductor devices such as insulated gate bipolar transistors (IGBTs), metal oxide semiconductor field effect transistors (MOSFETs), and the like are used in applications such as power conversion and the like. It is desirable to improve the latchup withstand capacity of such a semiconductor device.

DETAILED DESCRIPTION

Figure 1:
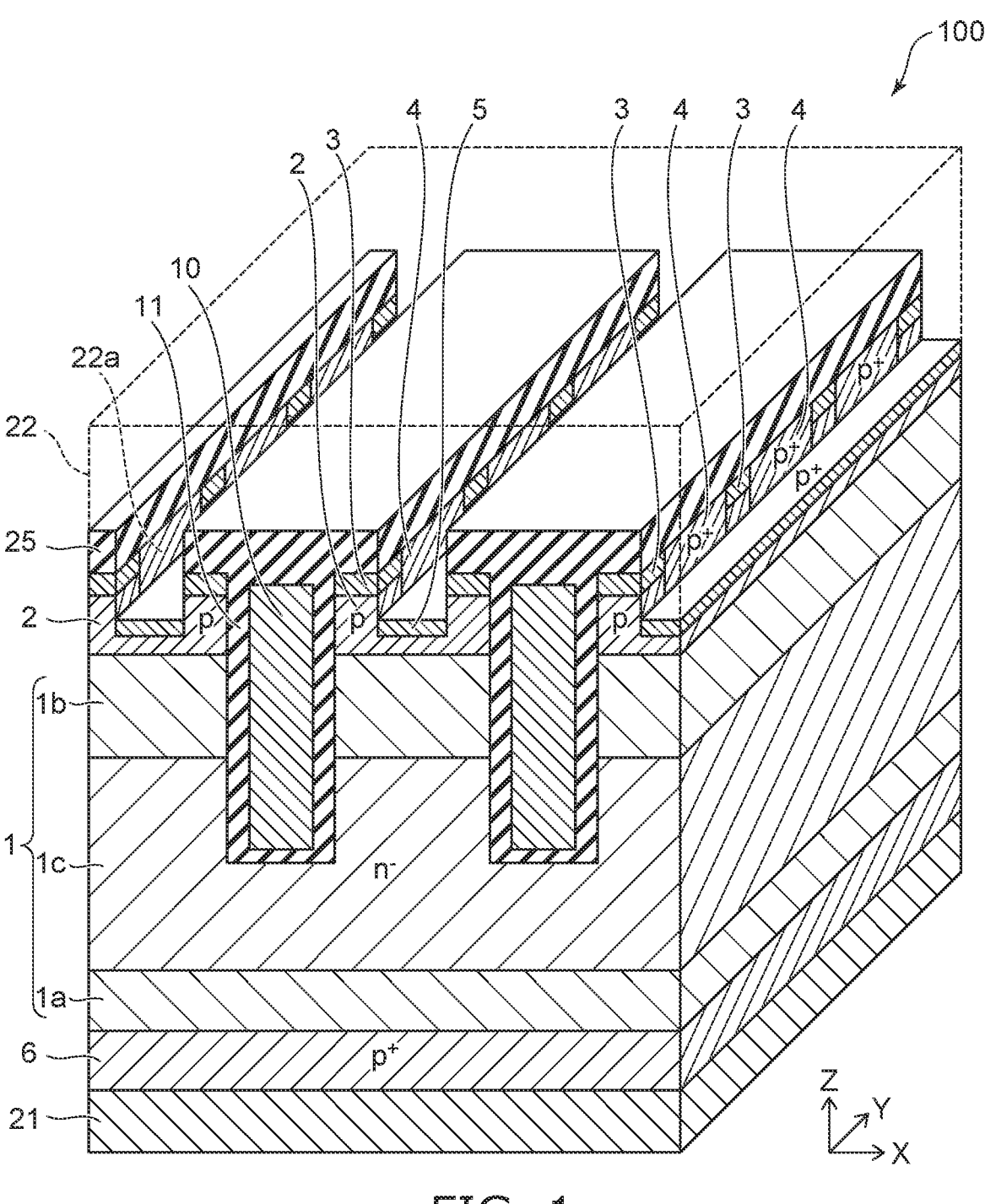
FIG. 1 is a perspective cross-sectional view showing a semiconductor device according to an embodiment.

According to one embodiment, a semiconductor device includes a first electrode, a first semiconductor region of a first conductivity type, a second semiconductor region of a second conductivity type, a gate electrode, a third semiconductor region of the first conductivity type, a fourth semiconductor region of the second conductivity type, a second electrode, and a fifth semiconductor region of the second conductivity type. The first semiconductor region is located on the first electrode. The second semiconductor region is located on the first semiconductor region. The gate electrode faces the second semiconductor region via a gate insulating layer in a second direction. The second direction is perpendicular to a first direction. The first direction is from the first electrode toward the first semiconductor region. The third semiconductor region is located on the second semiconductor region. The fourth semiconductor region is located on the second semiconductor region. The fourth semiconductor region is arranged with the third semiconductor region in a third direction perpendicular to the first and second directions. A second-conductivity-type impurity concentration of the fourth semiconductor region is greater than a second-conductivity-type impurity concentration of the second semiconductor region. The second electrode is located on the second, third, and fourth semiconductor regions. The second electrode includes a contact part arranged with the third and fourth semiconductor regions in the second direction. The fifth semiconductor region is located between the second semiconductor region and the contact part in the first direction. A second-conductivity-type impurity concentration of the fifth semiconductor region is greater than the second-conductivity-type impurity concentration of the second semiconductor region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the following description and drawings, the notations of $n^+$, $n^-$, $p^+$, and p indicate relative levels of the impurity concentrations. In other words, a notation marked with "+" indicates that the impurity concentration is relatively greater than that of a notation not marked with either "+" or "−"; and a notation marked with "−" indicates that the impurity concentration is relatively less than that of a notation without any mark. When both a p-type impurity and an n-type impurity are included in each region, these notations indicate relative levels of the net impurity concentrations after the impurities are compensated.

In embodiments described below, each embodiment may be implemented by inverting the p-type and the n-type of the semiconductor regions.

FIG. 1 is a perspective cross-sectional view showing a semiconductor device according to an embodiment.

The semiconductor device 100 shown in FIG. 1 is an IGBT. The semiconductor device 100 includes an $n^-$-type (first-conductivity-type) drift region 1 (a first semiconductor region), a p-type (second-conductivity-type) base region 2 (a second semiconductor region), an $n^+$-type emitter region 3 (a third semiconductor region), a $p^+$-type contact region 4 (a fourth semiconductor region), a $p^+$-type contact region 5 (a fifth semiconductor region), a $p^+$-type collector region 6 (a sixth semiconductor region), a gate electrode 10, a collector electrode 21 (a first electrode), an emitter electrode 22 (a second electrode), and an insulating layer 25. The emitter electrode 22 is shown by a broken line in FIG. 1.

An XYZ orthogonal coordinate system is used in the description of the embodiments. The direction from the collector electrode 21 toward the $n^-$-type drift region 1 is taken as a Z-direction (a first direction). Two mutually-orthogonal directions perpendicular to the Z-direction are taken as an X-direction (a second direction) and a Y-direction (a third direction). In the description, the direction from the collector electrode 21 toward the $n^-$-type drift region 1 is called "up", and the opposite direction is called "down". These directions are based on the relative positional relationship between the collector electrode 21 and the $n^-$-type drift region 1 and are independent of the direction of gravity.

The collector electrode 21 is located at the lower surface of the semiconductor device 100. The $p^+$-type collector region 6 is located on the collector electrode 21 and electrically connected with the collector electrode 21. The $n^-$-type drift region 1 is located on the $p^+$-type collector region 6.

The p-type base region 2 is located on the $n^-$-type drift region 1. The $n^+$-type emitter region 3 and the $p^+$-type contact region 4 are located on the p-type base region 2. The $p^+$-type contact region 4 is arranged with the $n^+$-type emitter region 3 in the Y-direction. The $n^+$-type emitter region 3 and the $p^+$-type contact region 4 contact each other in the Y-direction.

The gate electrode 10 faces the p-type base region 2 via a gate insulating layer 11 in the X-direction. In the illustrated example, the gate electrode 10 also face portions of the $n^-$-type drift region 1, the $n^+$-type emitter region 3, and the $p^+$-type contact region 4 via the gate insulating layer 11.

The emitter electrode 22 is located on the p-type base region 2, the $n^+$-type emitter region 3, the $p^+$-type contact region 4, and the gate electrode 10 with the insulating layer 25 interposed. The emitter electrode 22 includes a contact part 22a extending toward the p-type base region 2. The contact part 22a extends through the insulating layer 25 in the Z-direction and is arranged with the $n^+$-type emitter region 3 and the $p^+$-type contact region 4 in the X-direction.

The $p^+$-type contact region 5 is located between the p-type base region 2 and the contact part 22a in the Z-direction. The $p^+$-type contact region 5 is positioned lower than the $n^+$-type emitter region 3. The p-type impurity concentrations of the $p^+$-type contact region 4 and the $p^+$-type contact region 5 each are greater than the p-type impurity concentration of the p-type base region 2.

The contact part 22a contacts the $n^+$-type emitter region 3, the $p^+$-type contact region 4, and the $p^+$-type contact region 5. Thereby, the p-type base region 2, the $n^+$-type emitter region 3, the $p^+$-type contact region 4, and the $p^+$-type contact region 5 are electrically connected with the emitter electrode 22. The gate electrode 10 and the emitter electrode 22 are electrically isolated from each other by the insulating layer 25.

Pluralities of each of the p-type base region 2, the $n^+$-type emitter region 3, the $p^+$-type contact region 4, the $p^+$-type contact region 5, and the gate electrode 10 are arranged in the X-direction. Each p-type base region 2, each $p^+$-type contact region 5, and each gate electrode 10 extend in the Y-direction. The $n^+$-type emitter region 3 and the $p^+$-type contact region 4 are alternately arranged in the Y-direction.

Operations of the semiconductor device 100 will now be described.

A voltage that is not less than a threshold is applied to the gate electrode 10 in a state in which a positive voltage with respect to the emitter electrode 22 is applied to the collector electrode 21. Thereby, a channel (an inversion layer) is formed in the p-type base region 2. Electrons are injected from the emitter electrode 22 into the $n^-$-type drift region 1 via the channel; and the semiconductor device 100 is set to the on-state. Holes are injected from the collector electrode 21 into the $n^-$-type drift region 1 according to the injection of the electrons. Conductivity modulation occurs due to the injected electrons and holes; and the electrical resistance in the $n^-$-type drift region 1 is reduced. Subsequently, when a potential that is less than the threshold is applied to the gate electrode 10, the channel of the p-type base region 2 disappears, and the semiconductor device 100 is switched to the off-state.

At turn-off of the semiconductor device 100, the electrons that are accumulated in the $n^-$-type drift region 1 are discharged to the collector electrode 21 via the $p^+$-type collector region 6. The holes that are accumulated in the $n^-$-type drift region 1 are discharged to the emitter electrode 22 from the $p^+$-type contact region 4 or the $p^+$-type contact region 5 via the gate insulating layer 11 vicinity and the p-type base region 2.

Examples of the materials of the components will now be described.

The $n^-$-type drift region 1, the p-type base region 2, the $n^+$-type emitter region 3, the $p^+$-type contact region 4, the $p^+$-type contact region 5, and the $p^+$-type collector region 6 include silicon, silicon carbide, gallium nitride, or gallium arsenide as a semiconductor material. Arsenic, phosphorus, or antimony can be used as the n-type impurity when silicon is used as the semiconductor material. Boron can be used as the p-type impurity. The gate electrode 10 includes a conductive material such as polysilicon, etc. The gate insulating layer 11 and the insulating layer 25 include insulating materials such as silicon oxide, silicon nitride, silicon oxynitride, etc. The collector electrode 21 and the emitter electrode 22 include metals such as titanium, tungsten, aluminum, etc. The contact part 22a also includes a metal. For example, the emitter electrode 22 that includes the contact part 22a has a stacked structure of titanium, titanium nitride, and aluminum.

For example, the impurity concentrations of the semiconductor regions can be set as follows. The n-type impurity concentration of the $n^-$-type drift region 1 is $1.0 \times 10^{13}$ to $1.0 \times 10^{15}$ atoms/cm³. The p-type impurity concentration of the p-type base region 2 is $1.0 \times 10^{16}$ to $1.0 \times 10^{18}$ atoms/cm³. The n-type impurity concentration of the $n^+$-type emitter region 3 is $1.0 \times 10^{17}$ to $1.0 \times 10^{21}$ atoms/cm³. The p-type impurity concentrations of the $p^+$-type contact region 4, the $p^+$-type contact region 5, and the $p^+$-type collector region 6 each are $1.0 \times 10^{17}$ to $1.0 \times 10^{21}$ atoms/cm³.

As shown in FIG. 1, the $n^-$-type drift region 1 may include a buffer region 1a, a barrier region 1b, and an intermediate region 1c.

The buffer region 1a is located between the $p^+$-type collector region 6 and the intermediate region 1c. When the semiconductor device 100 is switched to the off-state, a depletion layer spreads from the p-n junction between the $n^-$-type drift region 1 and the p-type base region 2. By providing the buffer region 1a, the spreading of the depletion layer can be suppressed, and the depletion layer can be prevented from reaching the $p^+$-type collector region 6.

The barrier region 1b is located between the intermediate region 1c and the p-type base region 2 and positioned between the gate electrodes 10. By providing the barrier region 1b, the electrical resistance for holes can be increased. Accordingly, when the semiconductor device 100 is in the on-state, the holes that are accumulated in the intermediate region 1c are not easily discharged to the emitter electrode 22; and the carrier concentration in the intermediate region 1c can be increased. As a result, the on-resistance of the semiconductor device 100 can be reduced.

The n-type impurity concentrations of the buffer region 1a and the barrier region 1b each are greater than the n-type impurity concentration of the intermediate region 1c. For example, the n-type impurity concentrations of the buffer region 1a and the barrier region 1b each are $1.0 \times 10^{15}$ to $1.0 \times 10^{18}$ atoms/cm³. The n-type impurity concentration of the intermediate region 1c is $1.0 \times 10^{13}$ to $1.0 \times 10^{15}$ atoms/cm³.

Advantages of the embodiment will now be described.

The semiconductor device 100 includes a parasitic thyristor made of the $p^+$-type collector region 6, the $n^-$-type drift region 1, the p-type base region 2, and the $n^+$-type emitter region 3. When the holes are discharged from the $n^-$-type drift region 1, a parasitic thyristor may operate when the potential rises in the p-type base region 2 at the $n^+$-type emitter region 3 vicinity. A large current flows in the semiconductor device 100 when the parasitic thyristor operates, and breakdown of the semiconductor device 100 occurs. It is therefore desirable to reduce the potential rise in the p-type base region 2 at the $n^+$-type emitter region 3 vicinity when discharging the holes.

Figure 2:
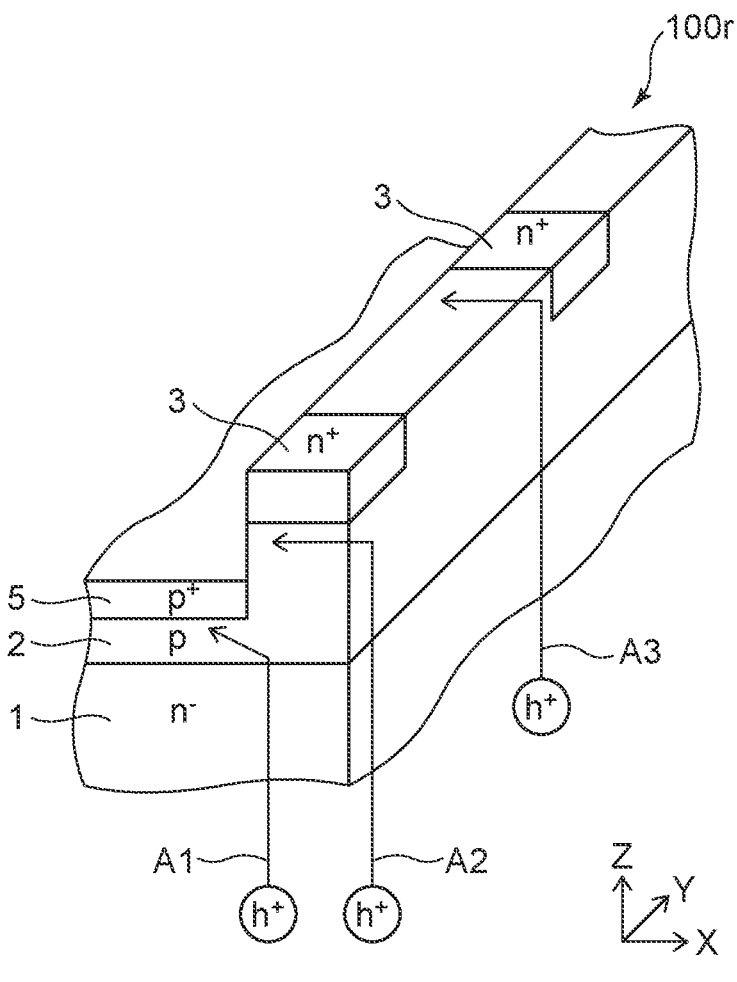
FIG. 2 is a perspective cross-sectional view showing a portion of a semiconductor device according to a reference example.

FIG. 2 is a perspective cross-sectional view showing a portion of a semiconductor device according to a reference example.

The semiconductor device 100r according to the reference example shown in FIG. 2 does not include the $p^+$-type contact region 4. At turn-off of the semiconductor device 100r, the holes h pass through the gate insulating layer 11 vicinity and the p-type base region 2 and are discharged to the emitter electrode 22. FIG. 2 illustrates some of the hole h paths at this time. In a path A1, the holes h reach the p-type base region 2 and then flow toward the $p^+$-type contact region 5. In a path A2, the holes h flow along the gate insulating layer 11 through the p-type base region 2 and then pass through the lower surface vicinity of the $n^+$-type emitter region 3. In a path A3, the holes h flow along the gate insulating layer 11 and then pass through the side surface vicinity of the $n^+$-type emitter region 3. Here, the side surface is the Y-direction end surface. In the path A2 or A3, the holes h pass through the vicinity of the $n^+$-type emitter region 3. Therefore, there is a possibility that a parasitic thyristor may operate when many holes h flow through the path A2 or A3.

Figure 3:
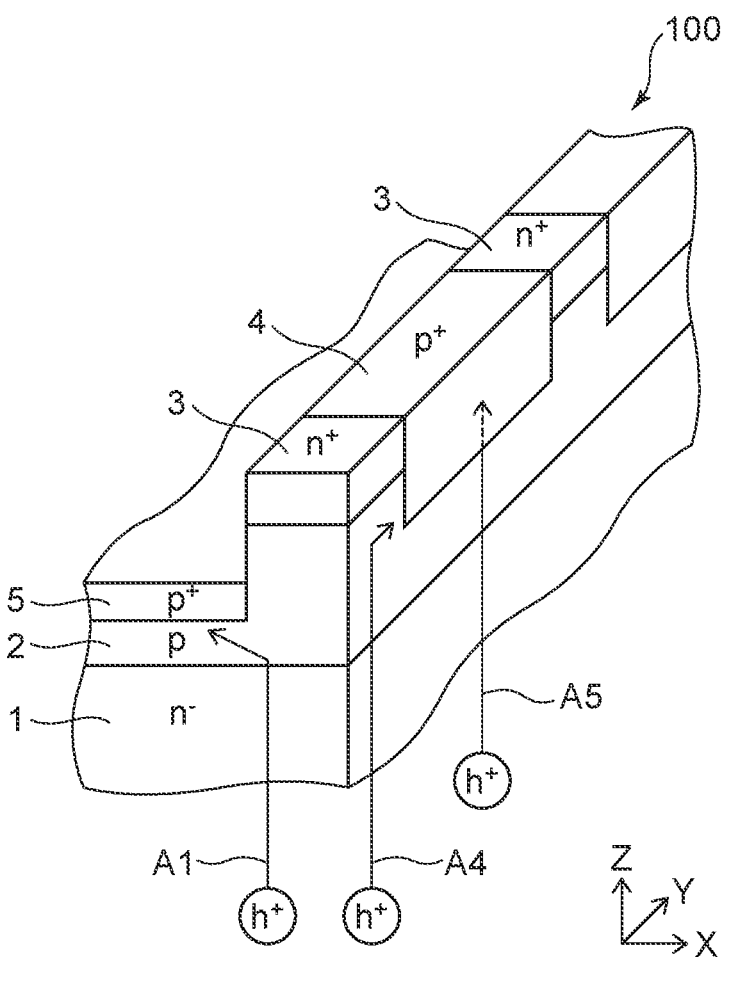
FIG. 3 is a perspective cross-sectional view showing a portion of the semiconductor device according to the embodiment.

FIG. 3 is a perspective cross-sectional view showing a portion of the semiconductor device according to the embodiment.

In the semiconductor device 100 according to the embodiment, the $p^+$-type contact region 4 is located next to the $n^+$-type emitter region 3 and the contact part 22a. FIG. 3 illustrates some of the hole h paths of the semiconductor device 100. In a path A4 or A5, the holes h flow along the gate insulating layer 11 and then move to the $p^+$-type contact region 5. In other words, the path A3 shown in FIG. 2 does not exist in the semiconductor device 100. Also, the amount of holes h passing through the path A2 can be reduced. Therefore, compared to the semiconductor device 100r, the rise of the potential in the p-type base region 2 at the $n^+$-type emitter region 3 vicinity can be suppressed according to the embodiment. In the semiconductor device 100, the likelihood of a parasitic thyristor operating can be reduced, and the latchup withstand capacity can be improved.

Figure 4A:
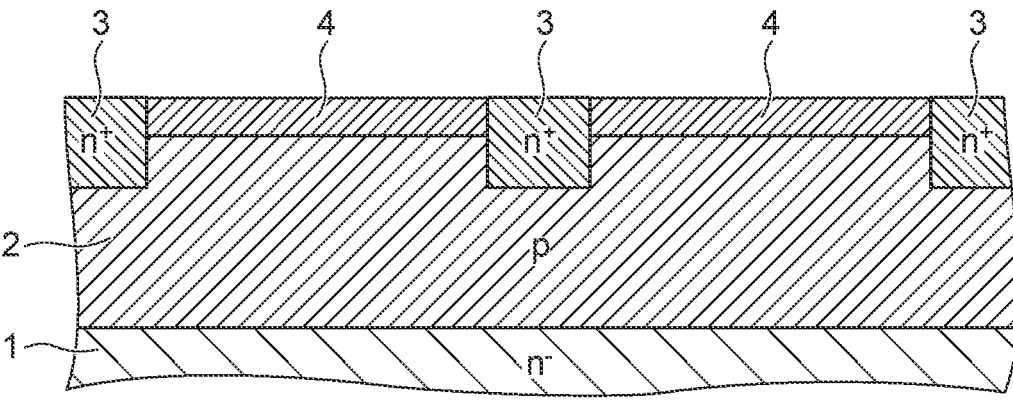
FIGS. 4A and 4B are cross-sectional views showing portions of the semiconductor device according to the embodiment.
Figure 4B:
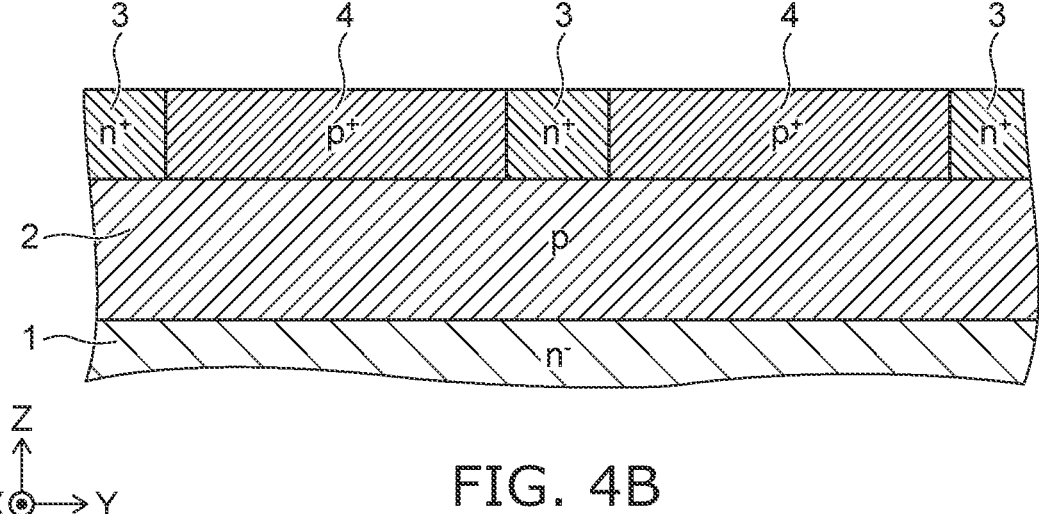
Figure 5A:
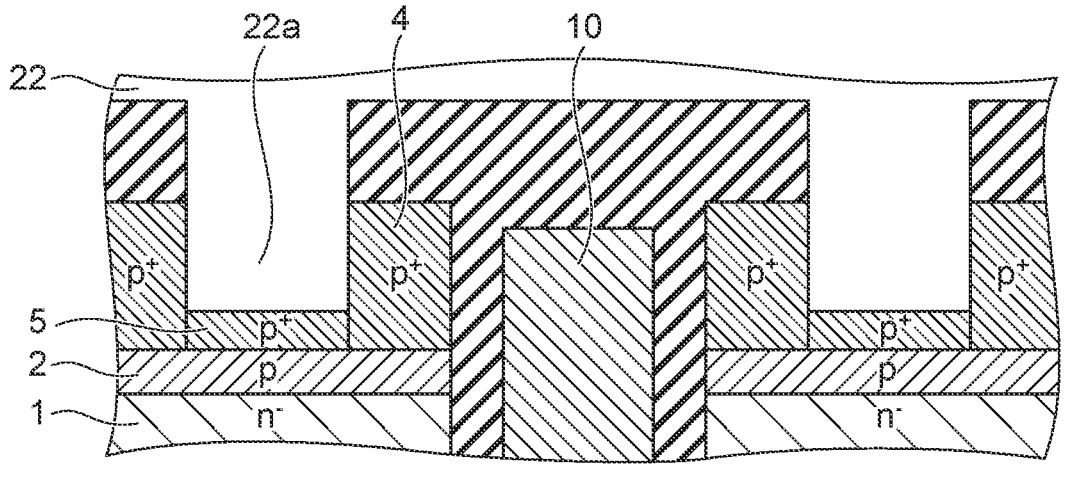
FIGS. 5A and 5B are cross-sectional views showing portions of the semiconductor device according to the embodiment.
Figure 5B:
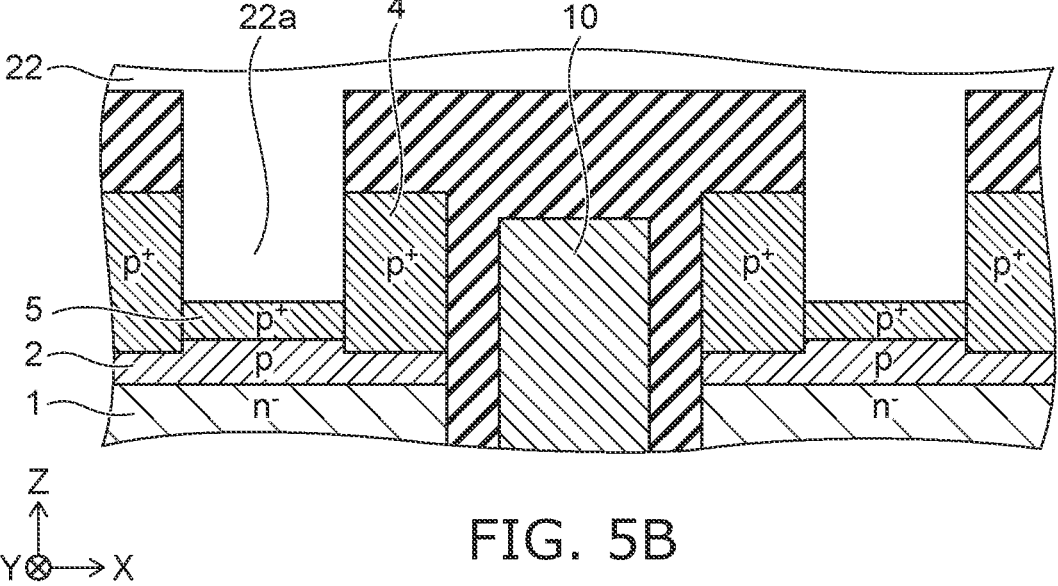

FIG. 4A, FIG. 4B, FIG. 5A, and FIG. 5B are cross-sectional views showing portions of the semiconductor device according to the embodiment. FIGS. 4A and 4B show a portion of the Y-Z cross section of the semiconductor device 100. FIGS. 5A and 5B show a portion of the X-Z cross section of the semiconductor device 100.

As shown in FIG. 4A, the lower end of the $p^+$-type contact region 4 may be positioned higher than the lower end of the $n^+$-type emitter region 3. According to the structure shown in FIG. 4A, compared to the semiconductor device 100r, the amount of holes h flowing through the path A2 or A3 shown in FIG. 2 can be reduced. Therefore, compared to the semiconductor device 100r, the latchup withstand capacity can be improved.

For example, the Z-direction position of the lower end of the $p^+$-type contact region 4 is determined by the following method. First, the maximum p-type impurity concentration of the $p^+$-type contact region 4 is determined. The p-type impurity concentration of the p-type base region 2 is determined at a position separated from the $p^+$-type contact region 4 and the $p^+$-type contact region 5. The set of points having an intermediate value between the two p-type impurity concentrations of the p-type base region 2 and the $p^+$-type contact region 4 corresponds to the lower surface of the $p^+$-type contact region 4. The lowermost point of the lower surface is the lower end.

As shown in FIG. 4B, the lower end of the $p^+$-type contact region 4 may be positioned at the same height as the lower end of the $n^+$-type emitter region 3. According to the structure shown in FIG. 4B, the latchup withstand capacity can be further improved because the path A3 shown in FIG. 2 does not exist. The "height" corresponds to the Z-direction position.

As shown in FIG. 5A, the lower end of the $p^+$-type contact region 4 may be positioned at the same height as a portion of the $p^+$-type contact region 5. The $p^+$-type contact region 4 may contact the $p^+$-type contact region 5. In the illustrated example, the lower end of the $p^+$-type contact region 4 is positioned at the same height as the lower end of the $p^+$-type contact region 5.

As shown in FIG. 5B, the lower end of the $p^+$-type contact region 4 may be positioned lower than the lower end of the $p^+$-type contact region 5. As shown in FIG. 5A or FIG. 5B, the holes that flow through the gate insulating layer 11 vicinity flow more easily toward the $p^+$-type contact region 4 as the lower end of the $p^+$-type contact region 4 moves to a deeper position. The amount of holes flowing through the $n^+$-type emitter region 3 vicinity can be further reduced and the latchup withstand capacity of the semiconductor device 100 can be further improved.

For example, the Z-direction position of the lower end of the $p^+$-type contact region 5 is determined by the following method. First, the maximum p-type impurity concentration of the $p^+$-type contact region 5 is determined. The p-type impurity concentration of the p-type base region 2 is determined at a position separated from the $p^+$-type contact region 4 and the $p^+$-type contact region 5. The set of points below the $p^+$-type contact region 5 having an intermediate value between the two p-type impurity concentrations corresponds to the lower surface of the $p^+$-type contact region 5. The lowermost point of the lower surface is the lower end.

The p-type impurity concentration of the $p^+$-type contact region 4 may be equal to the p-type impurity concentration of the $p^+$-type contact region 5. The p-type impurity concentration of the $p^+$-type contact region 4 may be greater than the p-type impurity concentration of the $p^+$-type contact region 5. In such a case, the holes flow more easily to the $p^+$-type contact region 4. The latchup withstand capacity of the semiconductor device 100 can be further improved thereby. The p-type impurity concentration of the $p^+$-type contact region 4 may be less than the p-type impurity concentration of the $p^+$-type contact region 5. The semiconductor device 100 includes a built-in diode made of the $n^-$-type drift region 1 and the p-type base region 2. When the p-type impurity concentration of the $p^+$-type contact region 4 is low, the injection of the holes via the $p^+$-type contact region 4 can be suppressed when the built-in diode operates. At turn-off of the built-in diode, the discharge amount of the carriers can be reduced, and the switching loss of the semiconductor device 100 can be reduced.

Figure 6A:
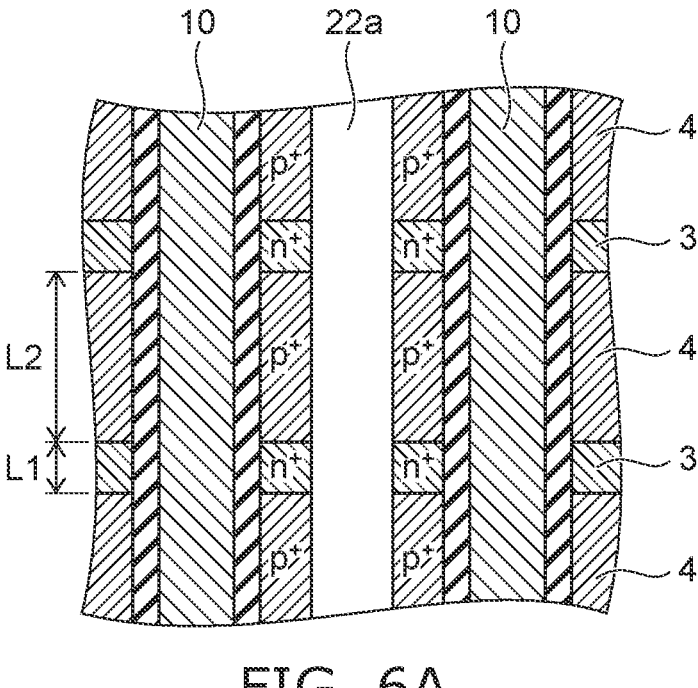
FIGS. 6A and 6B are plan views showing a portion of the semiconductor device according to the embodiment.
Figure 6B:
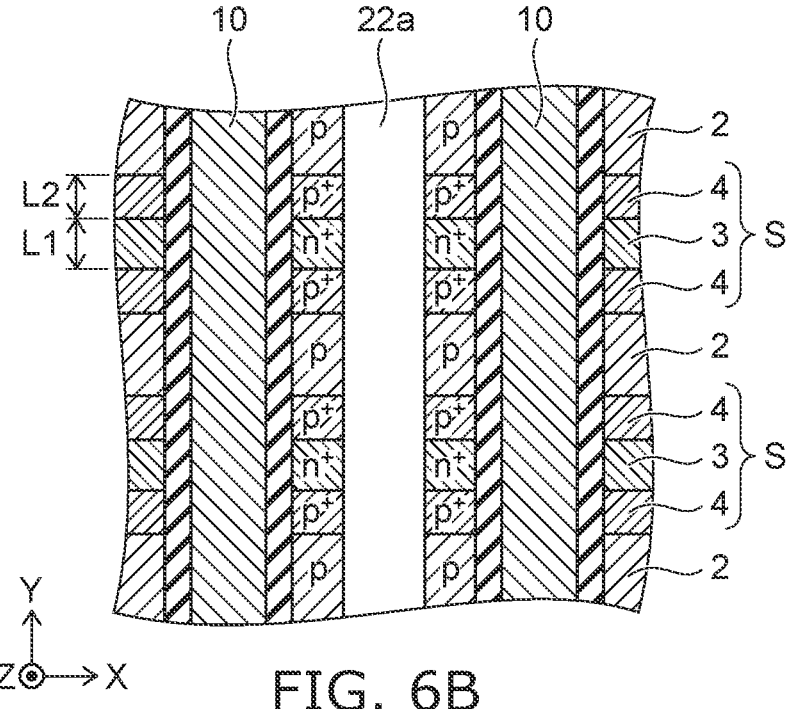

FIGS. 6A and 6B are plan views showing a portion of the semiconductor device according to the embodiment.

For example, as shown in FIG. 6A, the $n^+$-type emitter region 3 and the $p^+$-type contact region 4 are alternately arranged in the Y-direction. A length L2 in the Y-direction of the p$^+$-type contact region 4 is greater than a length L1 in the Y-direction of the n$^+$-type emitter region 3. The length L2 is equal to the distance between the n$^+$-type emitter regions 3 in the Y-direction. When the length L2 is greater than the length L1, the holes flow more easily to the p$^+$-type contact region 4. The latchup withstand capacity of the semiconductor device 100 can be further improved thereby.

As shown in FIG. 6B, a pair of p$^+$-type contact regions 4 may be arranged in the Y-direction; and the n$^+$-type emitter region 3 may be located between the pair of p$^+$-type contact regions 4. In such a case, the length L2 of the p$^+$-type contact region 4 may be less than the length L1 of the n$^+$-type emitter region 3. Multiple sets S that include the n$^+$-type emitter region 3 and the pair of p$^+$-type contact regions 4 are arranged in the Y-direction. A portion of the p-type base region 2 is positioned between the sets S that are next to each other in the Y-direction. When the length L2 is less than the length L1, the injection of the holes via the p$^+$-type contact region 4 when the built-in diode operates can be suppressed. As a result, the switching loss of the semiconductor device 100 can be reduced.

Modification

Figure 7:
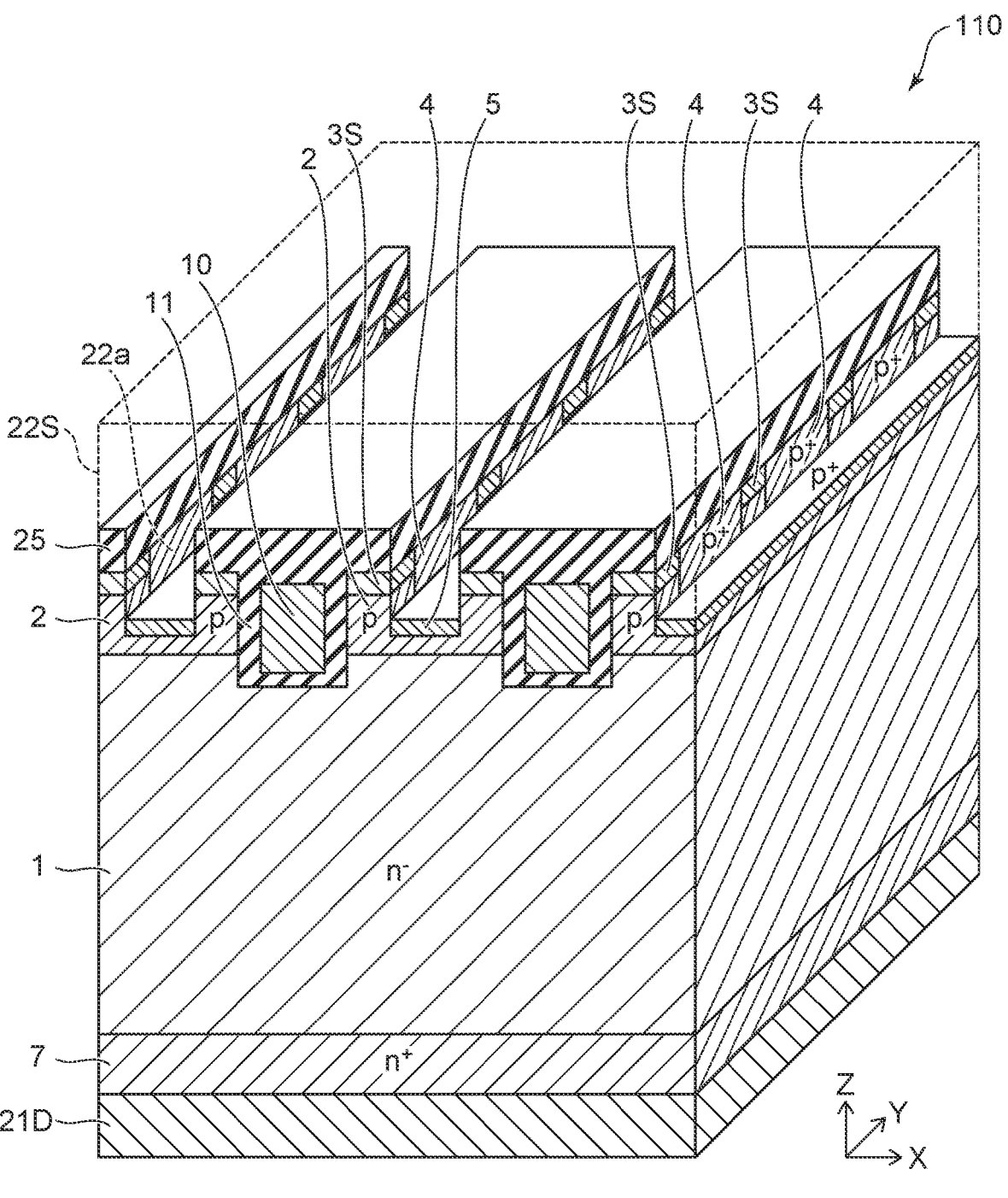
FIG. 7 is a perspective cross-sectional view showing a semiconductor device according to a modification of the embodiment.

FIG. 7 is a perspective cross-sectional view showing a semiconductor device according to a modification of the embodiment.

The semiconductor device 110 according to the modification shown in FIG. 7 is a MOSFET. Compared with the semiconductor device 100, the semiconductor device 110 includes an n$^+$-type drain region 7 instead of the p$^+$-type collector region 6. The semiconductor device 110 includes an n$^+$-type source region 3S, a drain electrode 21D (the first electrode), and a source electrode 22S (the second electrode) instead of the n$^+$-type emitter region 3, the collector electrode 21, and the emitter electrode 22. The n$^-$-type drift region 1 does not include the buffer region 1a and the barrier region 1b.

The structures of the n$^+$-type emitter region 3, the collector electrode 21, and the emitter electrode 22 are applicable respectively to the structures of the n$^+$-type source region 3S, the drain electrode 21D, and the source electrode 22S. The n$^+$-type drain region 7 is located between the drain electrode 21D and the n$^-$-type drift region 1. The n$^+$-type drain region 7 includes a semiconductor material. The n-type impurity concentration of the n$^+$-type drain region 7 is greater than the n-type impurity concentration of the n$^-$-type drift region 1.

When a voltage that is not less than a threshold is applied to the gate electrode 10 in a state in which a positive voltage with respect to the source electrode 22S is applied to the drain electrode 21D, the semiconductor device 110 is set to the on-state. Electrons flow from the source electrode 22S toward the drain electrode 21D via a channel. When the voltage that is applied to the gate electrode 10 drops below the threshold, the channel in the p-type base region 2 disappears, and the semiconductor device 110 is switched to the off-state.

When the semiconductor device 110 is switched to the off-state, the voltage that is applied to the semiconductor device 110 may temporarily increase greatly, and avalanche breakdown may occur. At this time, a large number of carriers (electrons and holes) is generated. The electrons pass through the n$^+$-type drain region 7 and are discharged through the drain electrode 21D. The holes pass through the p-type base region 2 and are discharged from the source electrode 22S.

The semiconductor device 110 includes a parasitic bipolar transistor made of the n$^-$-type drift region 1, the p-type base region 2, and the n$^+$-type source region 3S. Therefore, at turn-off of the semiconductor device 110, it is desirable to reduce the rise of the potential of the p-type base region 2 at the vicinity of the n$^+$-type source region 3S.

The p$^+$-type contact region 4 is included in the semiconductor device 110 as well. Therefore, similarly to the semiconductor device 100, the amount of holes passing through the vicinity of the n$^+$-type source region 3S can be reduced. In the semiconductor device 110 according to the modification, the likelihood of a parasitic bipolar transistor operating can be reduced, and the latchup withstand capacity can be improved.

The embodiment may include the following configurations.

(Clause 1)

A semiconductor device, comprising:

a first electrode;

a first semiconductor region located on the first electrode, the first semiconductor region being of a first conductivity type;

a second semiconductor region located on the first semiconductor region, the second semiconductor region being of a second conductivity type;

a gate electrode facing the second semiconductor region via a gate insulating layer in a second direction, the second direction being perpendicular to a first direction, the first direction being from the first electrode toward the first semiconductor region;

a third semiconductor region located on the second semiconductor region, the third semiconductor region being of the first conductivity type;

a fourth semiconductor region located on the second semiconductor region, the fourth semiconductor region being of the second conductivity type, the fourth semiconductor region being arranged with the third semiconductor region in a third direction perpendicular to the first and second directions, a second-conductivity-type impurity concentration of the fourth semiconductor region being greater than a second-conductivity-type impurity concentration of the second semiconductor region;

a second electrode located on the second, third, and fourth semiconductor regions, the second electrode including a contact part arranged with the third and fourth semiconductor regions in the second direction; and a fifth semiconductor region located between the second semiconductor region and the contact part in the first direction, the fifth semiconductor region being of the second conductivity type, a second-conductivity-type impurity concentration of the fifth semiconductor region being greater than the second-conductivity-type impurity concentration of the second semiconductor region.

(Clause 2)

The semiconductor device according to Clause 1, wherein a lower end of the fourth semiconductor region is positioned at a same height as a lower end of the fifth semiconductor region or lower than the lower end of the fifth semiconductor region.

9                                                                    10

(Clause 3)

The semiconductor device according to Clause 1, wherein a lower end of the fourth semiconductor region is positioned at a same height as a lower end of the fifth semiconductor region or lower than the lower end of the fifth semiconductor region.

(Clause 4)

The semiconductor device according to Clause 3, wherein the fourth semiconductor region contacts the fifth semiconductor region.

(Clause 5)

The semiconductor device according to any one of Clauses 1 to 4, comprising:

a pair of the fourth semiconductor regions separated from each other in the third direction, the third semiconductor region being positioned between the pair of fourth semiconductor regions.

(Clause 6)

The semiconductor device according to Clause 5, wherein the third semiconductor region and the pair of fourth semiconductor regions are included in a set, a plurality of sets is arranged in the third direction, and a portion of the second semiconductor region is located between sets among the plurality of sets next to each other in the third direction.

(Clause 7)

The semiconductor device according to any one of Clauses 1 to 4, wherein a length in the third direction of the fourth semiconductor region is greater than a length in the third direction of the third semiconductor region.

(Clause 8)

The semiconductor device according to Clause 7, wherein a plurality of the third semiconductor regions and a plurality of the fourth semiconductor regions are alternately arranged in the third direction.

(Clause 9)

The semiconductor device according to any one of Clauses 1 to 8, further comprising:

a sixth semiconductor region located between the first electrode and the first semiconductor region, the sixth semiconductor region being of the second conductivity type.

The relative levels of the impurity concentrations between respective semiconductor regions according to the embodiments described above can be confirmed by, for example, Scanning Capacitance Microscopy (SCM). Carrier concentrations in the respective semiconductor regions can be considered to be equal to the impurity concentrations activated in the respective semiconductor regions. Therefore, the relative levels of the impurity concentrations between respective semiconductor regions can be confirmed by SCM as well. The impurity concentrations in the respective semiconductor regions can be measured by, for example, Secondary Ion Mass Spectrometry (SIMS).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:

a first electrode;

a first semiconductor region located on the first electrode, the first semiconductor region being of a first conductivity type;

a second semiconductor region located on the first semiconductor region, the second semiconductor region being of a second conductivity type;

a gate electrode facing the second semiconductor region via a gate insulating layer in a second direction, the second direction being perpendicular to a first direction, the first direction being from the first electrode toward the first semiconductor region;

a third semiconductor region located on the second semiconductor region, the third semiconductor region being of the first conductivity type;

a fourth semiconductor region located on the second semiconductor region, the fourth semiconductor region being of the second conductivity type, the fourth semiconductor region being arranged with the third semiconductor region in a third direction perpendicular to the first and second directions, a second-conductivity-type impurity concentration of the fourth semiconductor region being greater than a second-conductivity-type impurity concentration of the second semiconductor region;

a second electrode located on the second, third, and fourth semiconductor regions, the second electrode including a contact part arranged with the third and fourth semiconductor regions in the second direction; and a fifth semiconductor region located between the second semiconductor region and the contact part in the first direction, the fifth semiconductor region being of the second conductivity type, a second-conductivity-type impurity concentration of the fifth semiconductor region being greater than the second-conductivity-type impurity concentration of the second semiconductor region, wherein a lower end of the fourth semiconductor region is positioned at a same height as or lower than a lower end of the fifth semiconductor region, and a lower end of the contact part is positioned lower than a lower end of the third semiconductor region.

2. The device according to claim 1, wherein the lower end of the fourth semiconductor region is positioned at a same height as the lower end of the third semiconductor region or lower than the lower end of the third semiconductor region.

3. The device according to claim 1, wherein the fourth semiconductor region contacts the fifth semiconductor region.

4. The device according to claim 1, further comprising:

a pair of fourth semiconductor regions separated from each other in the third direction, the third semiconductor region being positioned between the pair of fourth semiconductor regions.

5. The device according to claim 4, wherein the third semiconductor region and the pair of fourth semiconductor regions are included in a set, a plurality of sets of the third semiconductor region and the pair of fourth semiconductor regions is arranged in the third direction, and a portion of the second semiconductor region is located between two sets that are among the plurality of sets and next to each other in the third direction.

6. The device according to claim 1, wherein a length in the third direction of the fourth semiconductor region is greater than a length in the third direction of the third semiconductor region.

7. The device according to claim 6, wherein a plurality of the third semiconductor regions and a plurality of the fourth semiconductor regions are alternately arranged in the third direction.

8. The device according to claim 1, further comprising:

a sixth semiconductor region located between the first electrode and the first semiconductor region, the sixth semiconductor region being of the second conductivity type.

9. The device according to claim 1, wherein the second semiconductor region and the contact part directly contact at least partially.

10. The device according to claim 5, wherein in each of the sets, a length of each of the fourth semiconductor regions in the third direction is shorter than a length of the third semiconductor region in the third direction.

11. The device according to claim 1, wherein the lower end of the fourth semiconductor region is positioned lower than the lower end of the fifth semiconductor region.

* * * * *